(12) United States Patent
Gindele et al.

(10) Patent No.: US 11,870,013 B2
(45) Date of Patent: Jan. 9, 2024

(54) HERMETICALLY SEALED OPTOELECTRONIC MODULE HAVING INCREASED OUTPUT OF ELECTROMAGNETIC RADIATION

(71) Applicant: SCHOTT AG, Mainz (DE)

(72) Inventors: Frank Gindele, Schweitenkirchen (DE); Christian Rakobrandt, Schwindegg (DE); Alexander Neumeier, Moosburg/Aich (DE); Robert Hettler, Kumhausen (DE)

(73) Assignee: SCHOTT AG, Mainz (DE)

( * ) Notice: Subject to any disclaimer, the term of this patent is extended or adjusted under 35 U.S.C. 154(b) by 262 days.

(21) Appl. No.: 17/341,228

(22) Filed: Jun. 7, 2021

(65) Prior Publication Data

US 2021/0384384 A1    Dec. 9, 2021

(30) Foreign Application Priority Data

Jun. 5, 2020   (DE) ..................... 10 2020 114 952.2

(51) Int. Cl.
| | | |
|---|---|---|
| *H01L 33/48* | (2010.01) | |
| *H01L 33/62* | (2010.01) | |
| *H01L 21/56* | (2006.01) | |
| *H01L 23/538* | (2006.01) | |

(52) U.S. Cl.
CPC ............ *H01L 33/483* (2013.01); *H01L 21/56* (2013.01); *H01L 23/5389* (2013.01); *H01L 33/62* (2013.01); *H01L 2924/15* (2013.01); *H01L 2933/0033* (2013.01)

(58) Field of Classification Search
CPC . H01L 21/56; H01L 2924/15; H01L 23/5389; H01L 33/52; H01L 33/58; H01L 2933/0033; H01L 33/483
See application file for complete search history.

(56) References Cited

U.S. PATENT DOCUMENTS

| | | | |
|---|---|---|---|
| 6,621,157 B1 | 9/2003 | Wirz | |
| 8,698,378 B2 | 4/2014 | Mueller | |
| 2003/0219207 A1 | 11/2003 | Guy | |
| 2004/0120155 A1* | 6/2004 | Suenaga | ................. H01L 33/62 |
| | | | 362/800 |

(Continued)

FOREIGN PATENT DOCUMENTS

WO    9801783    1/1998

*Primary Examiner* — Feifei Yeung Lopez
(74) *Attorney, Agent, or Firm* — Ruggiero McAllister & McMahon LLC

(57) ABSTRACT

An optoelectronic module is provided that has a carrier element, an optoelectronic element on the carrier element, a cover, and a cavity. The cover has a frame surrounding the optoelectronic element and connected to the carrier element. A glass element is on the frame lying substantially opposite the carrier element for the input and/or output of electromagnetic radiation. The cavity is inside a volume that is delimited by an inner surface of the cover and a surface of the carrier element. The optoelectronic element is arranged in the cavity and enclosed by the cover hermetically and/or in an autoclavable fashion. A filler material is in the cavity to compensate for an expansion of a volume occupied by the filler material and has a first deformable compensation volume, which is arranged adjacent to a subregion of the cover and/or of the carrier element.

23 Claims, 6 Drawing Sheets

(56) References Cited

U.S. PATENT DOCUMENTS

| | | |
|---|---|---|
| 2005/0239227 A1 | 10/2005 | Aanegola |
| 2009/0206352 A1 | 8/2009 | Becker |
| 2009/0296367 A1* | 12/2009 | Sekine .................... H01L 33/60 |
| | | 362/346 |
| 2011/0062575 A1 | 3/2011 | Lin |
| 2016/0285232 A1 | 9/2016 | Reinert |
| 2020/0185569 A1* | 6/2020 | Cheng .................... H01L 33/52 |

* cited by examiner

HERMETICALLY SEALED OPTOELECTRONIC MODULE HAVING INCREASED OUTPUT OF ELECTROMAGNETIC RADIATION

CROSS REFERENCE TO RELATED APPLICATIONS

This application claims benefit under 35 USC § 119 of German Application 10 2020 114 952.2, filed Jun. 5, 2021, the entire contents of which are incorporated herein by reference.

BACKGROUND

1. Field of the Invention

The present invention relates to a hermetically sealed optoelectronic module having increased output of electromagnetic radiation from the optoelectronic module, and to a method for producing such an optoelectronic module.

2. Description of Related Art

Optoelectronic elements or components, for example LEDs, are often encapsulated according to the prior art by epoxy resins and silicones, and also with glass packages, ceramic-glass packages or metal-glass packages. Such metal-glass packages or ceramic-class packages usually comprise a metal or ceramic package element and a transparent package element for input or output of electromagnetic radiation, in particular light, into the package or out from the package. The encapsulation of optoelectronic elements per se is used on the one hand to protect the optoelectronic element, and on the other hand to increase the output of electromagnetic radiation from the optoelectronic element, in which case an increased output of electromagnetic radiation may be achieved by a suitable selection of the refractive index of the material of the encapsulation. The optoelectronic element is applied onto a substrate, or a carrier element, and is encapsulated or enclosed by the corresponding package usually by means of a soldering process or welding process. A filler material is also sometimes used, which is introduced into the encapsulation or the package and is intended to contribute to an increase of the output of electromagnetic radiation.

For instance, US patent application US 2005/0239227 A1 describes a circuit board having at least one LED chip and a translucent cover, which surrounds the at least one LED chip and is connected at its open end to the circuit board. An internal volume, which contains the at least one LED chip and in which a transparent filler material such as silicone or epoxide covering the at least one LED chip is introduced, is defined by the inner surface of the cover and the circuit board. The light output is increased by the filler material, by the filler material leading to a light output-increasing change in the refractive index in the internal volume.

US patent application US 2003/0219207 A1 also uses a filler material in the form of an optical gel to adapt the refractive index, in order to increase the light output from a light source such as an LED into a light guide, for example an optical fiber. The optical gel fills a hollow space that surrounds the light emission surface and is enclosed by a plastic dome, in order to transfer light between the light source and the light guide when the light guide is not attached to the light-emitting surface.

US patent application US 2009/0206352 A1 discloses an LED chip surrounded by a package, the package comprising at least one base body and a cap formed by a glass body, and the LED chip being seated in a recess of the base body and on the latter. The primary radiation of the LED chip is at least partially converted by a conversion element into radiation with a longer wavelength, the conversion means being contained in the glass body of the cap and the refractive index of the glass body being more than 1.6, preferably at least n=1.7. The recess of the base body is filled with a filler material, which covers the LED chip and contains an immersion liquid as its main constituent and proportions of glass and phosphorus pigments, and contributes to increasing the conversion efficiency of the primary radiation of the LED chip.

A filler material according to the prior art, which is introduced into an internal volume that is delimited by a carrier element with an optoelectronic element such as an LED chip applied thereon and by a cover, or by a cap, expands with increasing temperature, in particular as a result of electromagnetic heat radiation or radiant heat. If the filler material fills the internal volume, in particular fully, as a result of its volume expansion with increasing temperature it exerts an increasing pressure onto the cover and also onto the carrier element with the optoelectronic element applied thereon. Besides cracks in the cover, which lead to a significant degradation of the efficiency of the output of electromagnetic radiation, the optoelectronic element may also be damaged by the pressure of the filler material exerted thereon.

SUMMARY

Accordingly, it is at least one object of the present invention to provide an improved hermetically sealed optoelectronic module having at least one optoelectronic element and a filler material covering the optoelectronic element, which overcomes the disadvantages mentioned above and at the same time has an increased output of electromagnetic radiation from the optoelectronic module. In particular, it is an object of the present invention that an increased output of electromagnetic radiation from the optoelectronic module takes place even if a volume change of the filler material occurs.

The optoelectronic module according to the invention comprises a carrier element, at least one optoelectronic element applied on the carrier element, a cover for the optoelectronic element, and a cavity. The cover of the optoelectronic module, which is also referred to as a cap, comprises a frame surrounding the optoelectronic element in the circumferential direction and connected to the carrier element, and a glass element applied on the frame and lying substantially opposite the carrier element for the input and/or output of electromagnetic radiation into or out from the cover. The cavity is formed inside a volume that is delimited at least partially by an inner surface of the cover and a surface of the carrier element. The optoelectronic element is arranged in the cavity in such a way that it is enclosed by the cover hermetically and/or in an autoclavable fashion. The optoelectronic module furthermore comprises a filler material with which the cavity is at least partially filled. The optoelectronic module is furthermore adapted and configured to compensate for an expansion of a volume occupied by the filler material, and to this end comprises at least one first deformable compensation volume.

It is also conceivable to configure the compensation volume in such a way that its volume can tend toward zero at or beyond exceeding or falling below a temperature threshold. The compensation volume is, however, typically present and effective in a temperature range of from −40° C. to +150° C., preferably from −25° C. to +125° C., which is conventional for applications of optoelectronic components.

The optoelectronic module according to the invention represents a solution to compensate for a volume expansion of a filler material covering the optoelectronic element or one introduced into a cavity, by providing at least one first deformable compensation volume for the optoelectronic module. In the event of a temperature increase inside the optoelectronic module, for example as a result of electromagnetic heat radiation or radiant heat, the filler material can expand at least into the first compensation volume. The at least one first compensation volume, which is originally not filled with filler material, is thereupon at least partially filled with expanding filler material. Because the filler material can expand at least into the first compensation volume, the filler material exerts much less or even almost no longer any pressure onto the carrier element with the optoelectronic element applied thereon, and/or onto the cover. The risk of damage to the cover and/or the optoelectronic element on the carrier element is therefore reduced significantly, if not eliminated, by the possibility for the filler material to expand at least into the first compensation volume, which leads to an increased output of electromagnetic radiation from the optoelectronic module.

In one exemplary embodiment, the filler material is a liquid, for example an oil, and during its expansion forms a surface that is curved, in particular convexly curved. Such a curved surface is referred to in hydrostatics as a meniscus and is based on the interaction between the liquid forming a meniscus and the surface of the wall adjacent to the liquid.

Besides the at least one compensation volume, a plurality of compensation volumes, i.e., a second, third, etc., deformable compensation volume originally not filled with filler material may also be provided in the optoelectronic module, the respective compensation volumes being spatially separated from one another.

When output of electromagnetic radiation or light output is referred to in the scope of the present invention, the term electromagnetic radiation or light refers to a predetermined spectral range and is not restricted to the spectrum of visible light. For example, infrared light or ultraviolet (UV) light may also be included by this predetermined spectral range. The glass element of the cover may for example be a glass window in the form of a glass plate, or it may also be shaped differently, for example convexly or concavely shaped. In particular, the glass element may also be configured as a lens. Besides glass windows, glass-ceramic windows, sapphire windows, quartz windows or silicon windows may for example also be used as a transparent glass element. A silicon window is in this case an example of a glass element that is only transparent for infrared light.

In one exemplary embodiment, the first deformable compensation volume may be adjacent to a subregion of the cover and/or a subregion of the carrier element of the optoelectronic module, so that interfaces with the least possible change in refractive index, which negatively affects the optical path of the electromagnetic radiation to be output, are formed inside the cover. If, in contrast to this embodiment according to the invention, the first compensation volume were not arranged adjacent to a subregion of the cover and/or of the carrier element, but for example between two mutually separated regions of a filler material and respectively directly adjacent to these regions of the filler material, more interfaces would be formed between the compensation volume and the filler material. This would negatively influence the optical path of the electromagnetic radiation to be output and reduce the efficiency of the output of electromagnetic radiation from the optoelectronic module. These transitions, then generally existing as interfaces with air or a gas, then have even greater refractive index changes, which entail high reflection losses.

As an alternative to the first compensation volume being adjacent to a subregion of the cover and/or a subregion of the carrier element of the optoelectronic module, in a further exemplary embodiment the at least one first compensation volume may also be fully surrounded by filler material. In particular, the at least one first compensation volume may be formed as a bubble which is located in the filler material-filled region of the optoelectronic module.

The compensation volume is preferably filled with a compressible medium, in particular a gaseous medium, or with a resilient medium. As an alternative, the compensation volume may be a vacuum. All these variants make it possible that, in the event of an expansion of the filler material into the compensation volume, the compensation volume can be compressed in favor of the filler material, so that the filler material can increase its volume into the compensation volume.

In one embodiment, a subregion of the cover and/or a subregion of the carrier element may be coated with a coating that is nonwetting for the filler material and/or nonadhesive for the filler material, so that the at least one first compensation volume is formed by detachment of the filler material from this coating. This coating must be carried out before the cavity is filled with filler material. If the cavity is filled with filler material after the coating, the filler material does not adhere to the nonwetting or nonadhesive coating. The filler material can be detached or retracted from this coating, so that the at least one first compensation volume is formed by the detachment.

In another embodiment, it is also conceivable that at least one subregion of the first compensation volume is coated with a coating that is nonwetting for the filler material and/or nonadhesive for the filler material. After introduction of the first compensation volume into the optoelectronic module and its at least partial coating, when the cavity is filled with filler material the filler material does not adhere to this coating and can be detached therefrom. This creates a second compensation volume, which is then present as a vacuum, while the first compensation volume is either a compressible medium or a resilient medium.

The optoelectronic module, in particular the cover or the carrier element, may for example comprise at least one flexible membrane, in particular connected to the frame or the carrier element, in order to compensate for an expansion of a volume occupied by the filler material. Such a membrane consists of a resilient and therefore expansible material, and is constituted in such a way that the filler material cannot pass through the membrane but is delimited, or retained, by the membrane when it expands. In the scope of the invention, more than one such flexible membrane may also be provided in the optoelectronic module, the corresponding membranes then being arranged spatially separated from one another.

According to one embodiment, the first compensation volume is arranged at least between an inner surface, facing toward the cavity, of the frame and/or a surface, facing toward the cavity, of the carrier element. If a flexible membrane is provided, it may curve outward into the first compensation volume when the filler material exerts pressure onto the membrane as a result of its volume expansion.

If the filler material expands in the direction of the first compensation volume, and therefore in the direction of the membrane, it may be delimited in its expansion direction by the membrane, without being hindered from further expansion in the direction of the compensation volume, however. Consequently, the filler material expands together with the deforming or outwardly curving membrane in the direction of the first compensation volume.

The at least one membrane of the optoelectronic module according to the invention preferably delimits the hermetically closed cavity. This means that a subregion of the cavity is delimited by the at least one membrane and is therefore directly adjacent to the at least one membrane. The cavity is consequently formed by a volume that is delimited by the inner surface of the cover, by a surface, facing toward the optoelectronic element, of the carrier element and by the at least one membrane. In such an embodiment, the membrane in addition to the cover and the carrier element is consequently a constituent of the hermetic encapsulation of the optoelectronic element.

As an alternative to or in combination with an above-described flexible membrane, the optoelectronic module may comprise a bimetallic element. In particular, in another embodiment, the frame of the cover may be configured to be at least partially bimetallic in order to compensate for an expansion of a volume occupied by the filler material. A bimetallic element comprises two layers of different metals connected to one another with a form fit or material fit, and is distinguished by the property that it changes its shape, in particular bends, in the event of a temperature change. The cause of the bending is that the metals used for the bimetallic composite, or the bimetallic element, have different thermal expansion coefficients and therefore also longitudinal expansion coefficients, and are consequently elongated by different distances during heating, which leads to bending because of the connection formed between them. In the case of a frame configured to be at least partially bimetallic, the bimetallic frame is designed in such a way that it bends outward, i.e., away from the cavity, in the event of a temperature increase, so that a hollow space that constitutes a second compensation volume is formed. The filler material can expand into this second compensation volume as a result of the temperature increase. The second compensation volume is preferably a different compensation volume than the at least one first compensation volume. The second compensation volume may, however, also be the at least one first compensation volume.

According to one embodiment, the filler material may in particular be a silicone, polymer, epoxy resin or oil, and/or the frame of the cover may be a ceramic or a metal, preferably a metal at least partially coated with glass or a ceramic at least partially coated with glass. The selection of the filler material may be carried out with the aid of its refractive index, and may in particular be made dependent on the refractive index of the glass element used and on the wavelength of the electromagnetic radiation to be input or output. In the case of a frame made of metal or ceramic with an at least partial coating of glass, the glass coating is used in particular to connect the frame to the carrier element.

Furthermore, the carrier element may for example consist at least partially of ceramic and/or metal, and preferably comprise an electrical layout for contacting the optoelectronic element. The optoelectronic element is, in particular, applied on the carrier element by a soldering process or adhesive bonding process.

Furthermore, according to one embodiment of the optoelectronic module according to the invention, the volume of the cavity is greater than the volume of the first compensation volume at least by a factor of 2.5.

Besides a flat, planar carrier element, in another embodiment the carrier element may also comprise a recess in which the optoelectronic element is arranged on the carrier element. In this case, the cavity is formed substantially by the recess of the carrier element.

Besides hermetic encapsulation of the optoelectronic element in the cavity, autoclavable enclosure of the optoelectronic element in the cavity may also be carried out in the scope of the present invention. Autoclavable enclosure means gas-tight closure, or enclosure, of the optoelectronic element 2 in a steam-sterilized cavity 11 for a certain length of time. In this case, the optoelectronic element 2 is closed in the cavity 11 in a gas-tight fashion for a duration of at least 15 minutes with steam at a temperature of usually from 110° C. to 140° C., preferably around 135° C., and a pressure of up to 3 bar as well as high humidity. For example, a channel that is permeable for gases and/or open for diffusion may thus also be formed from a compensation volume inside the optoelectronic module 1 toward the outside, i.e., outside of the optoelectronic module 1, for example for pressure equilibration when the optoelectronic element is enclosed in the cavity in an autoclavable fashion.

Furthermore, the present invention also relates to a method for producing a hermetic and/or autoclavable optoelectronic module, the method comprising the following steps: applying at least one optoelectronic element on a carrier element, connecting a cover, which comprises a frame and a glass element for the input and/or output of electromagnetic radiation into or out from the cover, to the carrier element in such a way that the frame of the cover is connected to the carrier element, the optoelectronic element is surrounded by the frame in the circumferential direction and the glass element of the cover lies substantially opposite the carrier element, and forming a cavity inside a volume that is delimited at least partially by an inner surface of the cover and a surface of the carrier element, so that the optoelectronic element is arranged in the cavity and hermetic and/or autoclavable enclosure of the optoelectronic element in the cavity takes place, either covering the optoelectronic element with a filler material before the step of connecting the cover to the carrier element or at least partially filling the cavity that is formed through at least one filling opening that extends through the carrier element, the frame or the glass element of the cover, and hermetic and/or autoclavable closure of the filling opening and of a vent opening after the filling, and forming at least one first deformable compensation volume inside the optoelectronic module.

The first compensation volume may be formed in various ways, as already described above by the corresponding embodiments relating to the optoelectronic module. After the step of applying the optoelectronic element on a carrier element, for example, in one embodiment coating of subregions of the frame and/or of the carrier element with a coating that is nonwetting for the filler material and/or nonadhesive for the filler material may be carried out.

The order of the method steps mentioned above does not in this case necessarily correspond to the sequence of method steps mentioned above. For example, the formation of the cavity may already be carried out before the connection of the cover.

The method according to the invention leads to the advantages already mentioned in relation to the optoelectronic module according to the invention.

In the above-described method according to the invention, in one embodiment, the connection of the cover to the carrier element for hermetic and/or autoclavable enclosure of the optoelectronic element is carried out in particular by one of the following processes: laser welding, the carrier element preferably being a ceramic or a metal and the frame preferably being a ceramic or a metal, in particular a metal coated with glass, resistance welding, soldering with a metal solder, the carrier element and the cover respectively having a surface that is suitable for forming a firm connection to a solder, and preferably comprising a solder preform, soldering with glass solder, adhesively bonding at least the frame and the glass element, the frame and the carrier element or the glass element and the carrier element with a filler material, adhesively bonding at least the frame and the glass element, the frame and the carrier element or the glass element and the carrier element with a silicone, polymer or joining material that differs from the filler material.

All the processes mentioned above respectively ensure that the optoelectronic element is enclosed in a hermetically sealed and/or autoclavable fashion by the cover and the carrier element and therefore contribute to the protection of the optoelectronic element from external influences.

In the method according to the invention, the closure of the filling opening and of the vent opening after filling of the cavity with the filler material, in the case of a filling opening and vent opening extending through the glass element, is preferably carried out by sealing with a glass solder or sealing with the filler material, which is preferably silicone or epoxy resin. In the case of a filling opening and vent opening extending through the carrier element or the frame, the closure of the filling opening and of the vent opening is preferably carried out by soldering of the metallized filling opening and vent opening or by welding with a metal solder. The vent opening is used for pressure equilibration in the cavity during the process of filling, in particular for expelling air enclosed in the cavity. After completion of the filling process, the filling opening and the vent opening need to be reclosed in order to ensure hermetic and/or autoclavable encapsulation of the optoelectronic element in the cavity, which may be carried out as described above.

According to one embodiment, in the method according to the invention, compensation for an expansion of a volume occupied by the filler material is carried out by outward curvature or deformation of at least one flexible membrane, preferably connected to the frame of the cover or to the carrier element. In this case, the at least one membrane curves outward in the direction of the first compensation volume. The first compensation volume is in this case arranged adjacent to the at least one membrane either at least between an inner surface, facing toward the cavity, of the frame and/or a surface, facing toward the cavity, of the carrier element and the at least one membrane or in a recess of the frame or of the carrier element. In another embodiment, the flexible membrane may also be formed by the surface of the filler material itself. For example, to this end the filler material may be hardened on its surface in order to form a membrane.

As an alternative to a flexible membrane, or in combination therewith, the method according to the invention may for example furthermore provide that compensation for an expansion of a volume occupied by the filler material is carried out by bending or deformation of at least one region, bearing on the filler material, of the frame of the cover, the frame being configured to be bimetallic at least in the region bearing on the filler material. As described above, a bimetallic composite that consists of two layers of different metals connected to one another with a form or material fit is distinguished by a shape change, in particular bending, in the event of a temperature change.

Furthermore the application of the optoelectronic element on the carrier element in the method according to the invention may be carried out, for example, by a soldering process or adhesive bonding process. Preferably, application of an electrical layout on the carrier element for contacting of the optoelectronic element is also carried out.

Optoelectronic modules according to the embodiments described above may be used inter alia on surfaces for skin treatments, tissue treatments, tumor treatments, UV-based industrial plants and vehicles. In general, the module may be used for UV-B or UV-C treatment of liquids or gases.

Further advantages, features and application possibilities of the present invention will become clearer with the aid of the following description of exemplary embodiments thereof and the associated figures.

DETAILED DESCRIPTION

Figure 1:
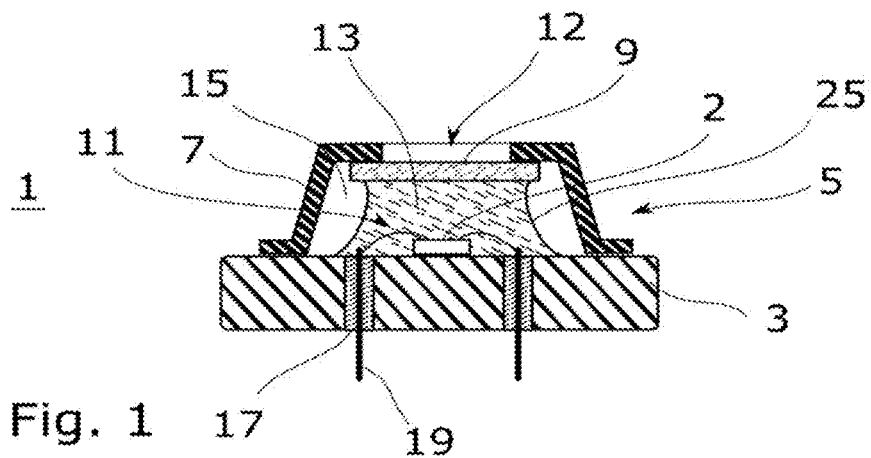
FIG. 1 shows a sectional view of an optoelectronic module according to the invention according to a first embodiment of the invention.
Figure 2:
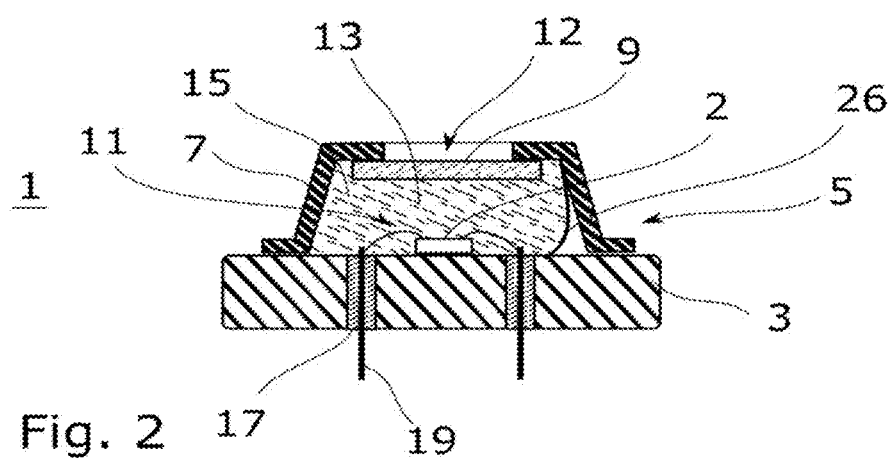
FIG. 2 shows a sectional view of an optoelectronic module according to the invention according to a second embodiment of the invention.

FIGS. 1 and 2 respectively show an optoelectronic module 1 according to a first (FIG. 1) and a second (FIG. 2) embodiment of the invention in a sectional view through the optoelectronic module 1. The optoelectronic module 1 of FIGS. 1 and 2 comprises a carrier element 3 and an optoelectronic element 2 applied thereon. The optoelectronic element 2 may for example be an LED chip and, for example, be soldered or adhesively bonded onto the carrier element. The carrier element 3 according to FIGS. 1 and 2 consists partially of ceramic, although in another embodiment it could consist at least partially of metal, possibly in combination with ceramic. For electrical contacting of the optoelectronic element 2, the carrier element 3 comprises electrical feed-throughs 17 with conductors 19 extending therein.

The optoelectronic module 1 shown in FIGS. 1 and 2 furthermore comprises a cover 5 for the optoelectronic element 2 and a cavity 11. The cover 5 comprises a frame 7, which fully surrounds the optoelectronic element 2 in the circumferential direction in FIGS. 1 and 2, is connected to the carrier element 3 and, in the present example of FIGS. 1 and 2, is configured as a package cap, as well as a glass element 9 lying substantially opposite the carrier element 3 for the input and/or output of electromagnetic radiation into or out from the cover 5. The frame 7 configured as a package cap comprises a frustoconical sleeve made of metal coated with glass having a through-opening 12 in the bottom surface for entry and exit of electromagnetic radiation. In order to produce the cover 5, the glass element 9 may be placed onto the inner side of the bottom surface, comprising the through-opening 12, of the package cap 7 and hermetically connected, preferably by means of glass solder. According to one embodiment, as may be seen in FIGS. 1 and 2, the glass element 9 is arranged not flush in an opening of the frame 7, or of the package cap 7, but offset in the direction of the optoelectronic element 2 relative to the frame 7 in relation to the assembled optoelectronic module 1. The glass element 9 is transparent, and in FIGS. 1 and 2 is configured by way of example as a glass window, although in another embodiment it could for example also be shaped convexly or concavely. As an alternative to a glass window, in another embodiment glass-ceramic windows, sapphire windows, quartz windows, or beam-deflecting optical elements such as lenses or prisms, may also be used as the transparent glass element.

The cavity 11 is respectively formed inside a volume that is delimited by an inner surface of the cover 5 and a surface, facing toward the optoelectronic element 2, of the carrier element 3. The optoelectronic element 2 is therefore arranged in the cavity 11 in such a way that it is hermetically enclosed, or encapsulated, by the cover 5 and the carrier element 3.

The optoelectronic module 1 of FIGS. 1 and 2 respectively comprises a filler material 13, which partially fills the cavity 11. The filler material 13 according to FIG. 1 is an oil, while the filler material according to FIG. 2 is an epoxy resin. In another embodiment, however, the filler material may also be a polymer or silicone. In FIGS. 1 and 2, the filler material was initially introduced into the inverted cover 5 consisting of the frame 7, or package cap, and the glass window 9, before the cover 5 was then hermetically connected to the carrier element 3. While in FIG. 1 the filler material 13 fills a volume inside the optoelectronic module 1 that is not adjacent to the frame 7 of the cover 5, in FIG. 2 the filler material 13 fills a larger volume compared with FIG. 1 inside the optoelectronic module 1 and, in contrast to FIG. 1, is mostly adjacent to the frame 7 of the cover 5.

Furthermore, the optoelectronic module 1 according to FIGS. 1 and 2 is respectively adapted and configured in order to compensate for an expansion of a volume occupied by the respective filler material 13, and to this end respectively comprises a deformable first compensation volume 15 inside the optoelectronic module 1, specifically in the cavity 11. The compensation volume 15 is respectively arranged adjacent to a subregion of the cover 5 and of the carrier element 3, and in FIGS. 1 and 2 is filled by way of example with air. In FIG. 1, the compensation volume 15 is adjacent to the entire inner surface of the frame 7 configured as a package cap, and fully surrounds the filler material 13 in the circumferential direction. The volume of the cavity 11 in FIG. 1 is greater than the volume of the compensation volume 15 by a factor of 2.5. In FIG. 2, however, there is a smaller compensation volume 15 in comparison with FIG. 1, which bears on a lower region of an inner surface of the frame 7 configured as a package cap and on a region of the carrier element 3. The volume of the cavity 11 in FIG. 2 is greater than the volume of the compensation volume 15 by a factor of about 15.

In FIG. 1, a temperature increase inside the optoelectronic module 1 that is relevant in respect of expansion of the filler material has not yet taken place, i.e., the filler material 13 has consequently not expanded. The surface of the filler material 13 is curved inward, i.e., in the direction of the optoelectronic element 2, and therefore concave, and forms a concave meniscus 25. A meniscus 25 formed by the surface of the filler material 13 is based on the interaction between the filler material 13 configured as oil and the surface of the carrier element 3 as well as of the glass element 9. In the event of a temperature increase, the filler material 13 in FIG. 1 would expand in the direction of the compensation volume 15, although this is not shown in FIG. 1. The surface of the filler material 13 would thereupon convexly curve outward and consequently form a convex meniscus. In the sense of this disclosure, a meniscus is intended to mean any interface with the compensation volume that is formed by the surface tension.

In contrast to FIG. 1, in order to compensate for the expansion of the volume occupied by the filler material 13, the optoelectronic module 1 in FIG. 2 comprises a flexible membrane 26, which in FIG. 2 is fastened on the frame 7 and on the carrier element 3. In FIG. 2, a temperature increase that would lead to the expansion of the filler material 13, has likewise not yet taken place. Consequently, the membrane 26 is in a relaxed state, i.e., pressure is not applied to it. In the event of a temperature increase inside the optoelectronic module 1, in particular caused by radiant heat formed inside the optoelectronic module 1, the filler material 13 can expand in a controlled way into the compensation volume 15 insofar as it is delimited, or retained, by the membrane 26 but cannot pass through the membrane 26 (this is not shown in FIG. 2). Because of the pressure exerted by the expanding filler material 13 onto the membrane 26, the membrane 26 deforms in the direction of the compensation volume 15, or correspondingly curves outward. The compensation volume 15 in FIG. 2 may therefore be defined as a volume which is delimited by an inner surface, facing toward the cavity 11, of the frame 7, a surface, facing toward the cavity 11, of the carrier element 3 and the membrane 26.

Figure 3:
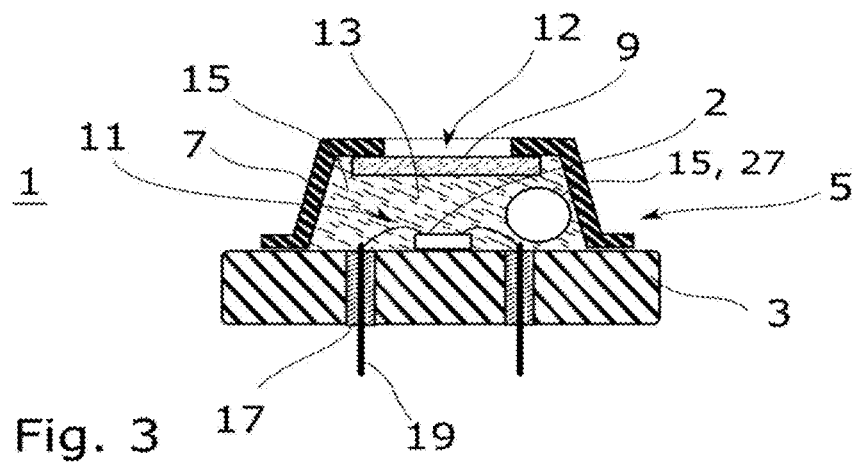
FIG. 3 shows a sectional view of an optoelectronic module according to the invention according to a third embodiment of the invention.

The optoelectronic module 1 represented in a sectional view in FIG. 3 according to a third embodiment corresponds in its basic structure to the optoelectronic modules shown in FIGS. 1 and 2. The optoelectronic module 1 represented in FIG. 3 differs, however, from the optoelectronic modules shown in FIGS. 1 and 2 in that the compensation volume 15 is not adjacent to a subregion of the frame 7 or of the cover 5, but rather is fully surrounded by the filler material 13. The compensation volume 15 in FIG. 3 is instead formed by way of example as a bubble 27, the cavity 11 of the optoelectronic module 1 being fully filled with filler material 13 apart from the compensation volume 15 formed as a bubble 27.

Figure 4:
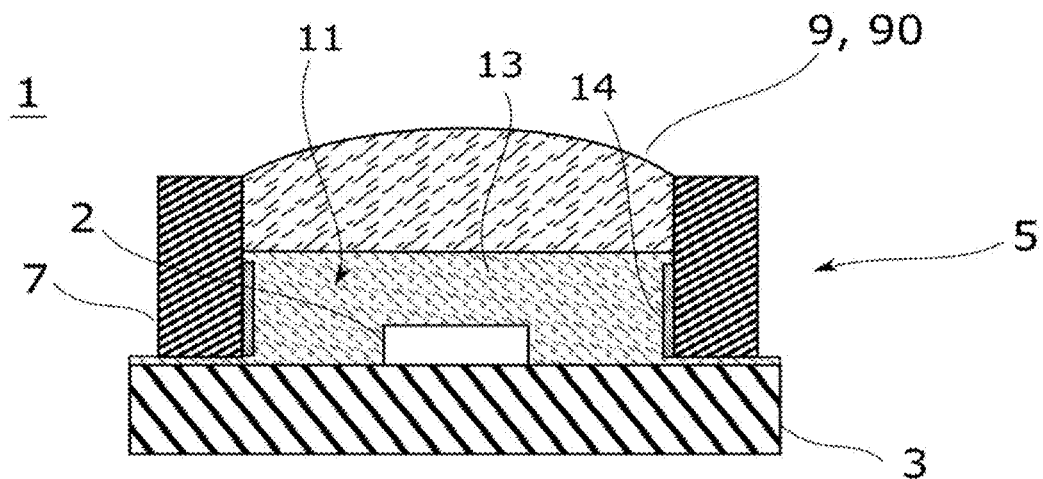
FIGS. 4-5 show a sectional view of an optoelectronic module according to the invention according to a fourth embodiment of the invention at two different points in time.
Figure 5:
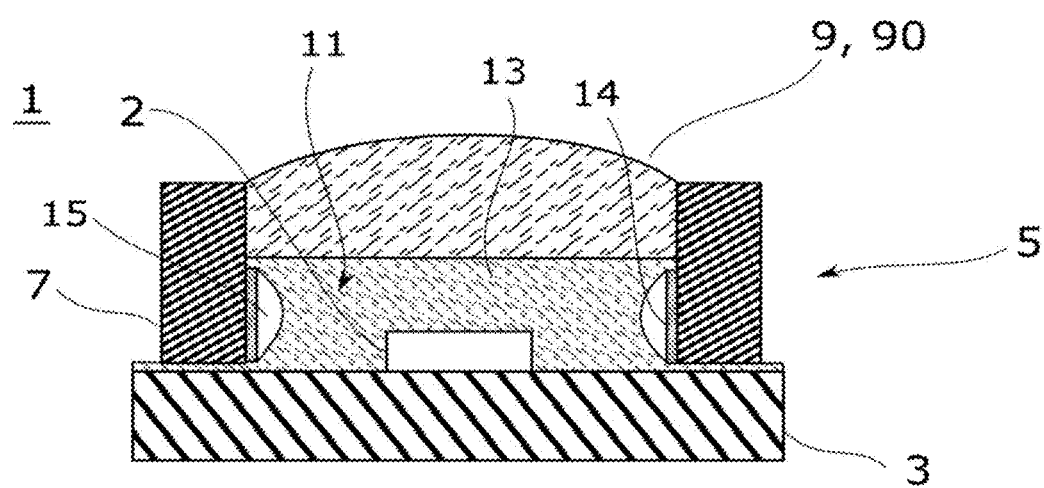

FIGS. 4 and 5 show a sectional view of an optoelectronic module 1 according to a fourth embodiment. They show a cover 5 consisting of a glass element 9, which by way of example is a lens 90, and a frame 7, which consists by way of example of a ceramic partially coated with glass, so that the frame is connected to the lens 90 by the glass coating. A subregion of the frame 7 is coated with a coating 14 that is nonwetting for the filler material 13 used and/or nonadhesive for the filler material 13 used, the coating being carried out before the introduction of the filler material 13 into the cavity 11. The cover 5, or the frame 7, is adhesively bonded to the carrier element 3 by means of the filler material 13, which by way of example is silicone and initially fills the cavity 11 substantially fully, so that the optoelectronic module 1 is hermetically sealed.

FIG. 5 shows that the filler material 13 has detached from the coating after it has been introduced into the cavity 11. A first compensation volume 15 is formed by the detachment of the filler material 13 from said coating 14. A compensation volume 15 in the optoelectronic module 1 may therefore also only be formed by the filler material 13 already introduced into the cavity 11 being detached from a nonwetting or nonadhesive coating and a free volume, the compensation volume 15, thereby being formed. Of course, the coating 14 must be selected in such a way that it does not have an adhesive effect for the material of the filler material 13, in the example represented for silicone. The term nonwetting and nonadhesive is therefore always to be interpreted in relation to the filler material 13 used.

Figure 6:
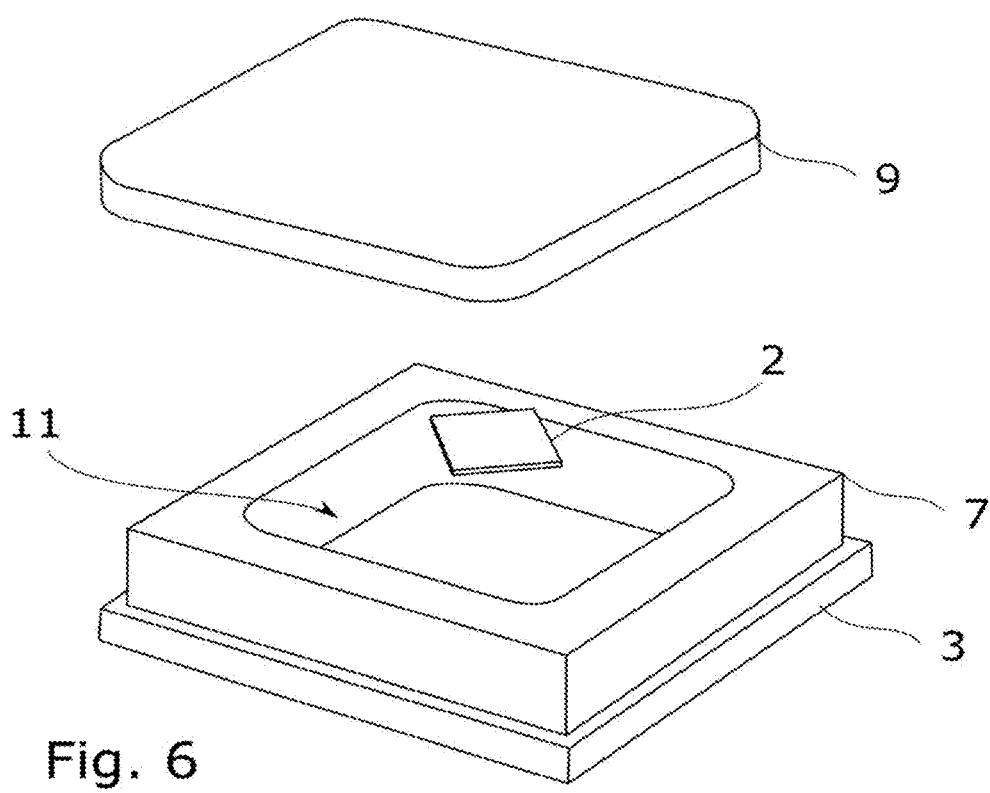
FIG. 6 shows a basic schematic structure of an optoelectronic module according to the invention before the introduction of filler material in a perspective view.

FIG. 6 shows a schematic structure of an optoelectronic module according to the invention in a perspective view, FIG. 3 as well as FIG. 4 being used to illustrate the basic structure of the optoelectronic module 1 before the filling of the cavity 11 with filler material. The features, essential to the invention, of a filler material 13 and of a compensation volume 15 have therefore been omitted. The optoelectronic element 2 is initially applied, by way of example by an adhesive bonding process, onto the carrier element 3, in FIG. 3 by way of example a ceramic, whereby, as an alternative thereto, a soldering process may also be envisioned in the scope of the invention. Furthermore, an electrical layout for contacting of the optoelectronic element 2 is applied onto the carrier element 3, although this is not revealed by FIG. 3. The cover consisting of the frame 7 and the glass element 9 is thereupon connected to the carrier element 3. The frame 7 of the cover, in FIG. 3 by way of example a ceramic, is placed onto the carrier element 3 and hermetically connected to the carrier element 3, the connection of the frame 7 to the carrier element 3 being carried out by way of example by laser welding in FIG. 3. The frame 7 fully surrounds the optoelectronic element 2 in the circumferential direction. The glass element 9 of the cover for the input and/or output of electromagnetic radiation into the cover or out from the cover is connected to the frame 7 so that the glass element 9 lies substantially opposite the carrier element 3. A cavity 11, which is delimited by an inner surface of the cover and by a surface, pointing in the direction of the optoelectronic element 2, of the carrier element 3 is formed inside a volume. The optoelectronic element 2 is therefore arranged in the cavity 11 and is hermetically enclosed in the cavity 11.

Figure 7:
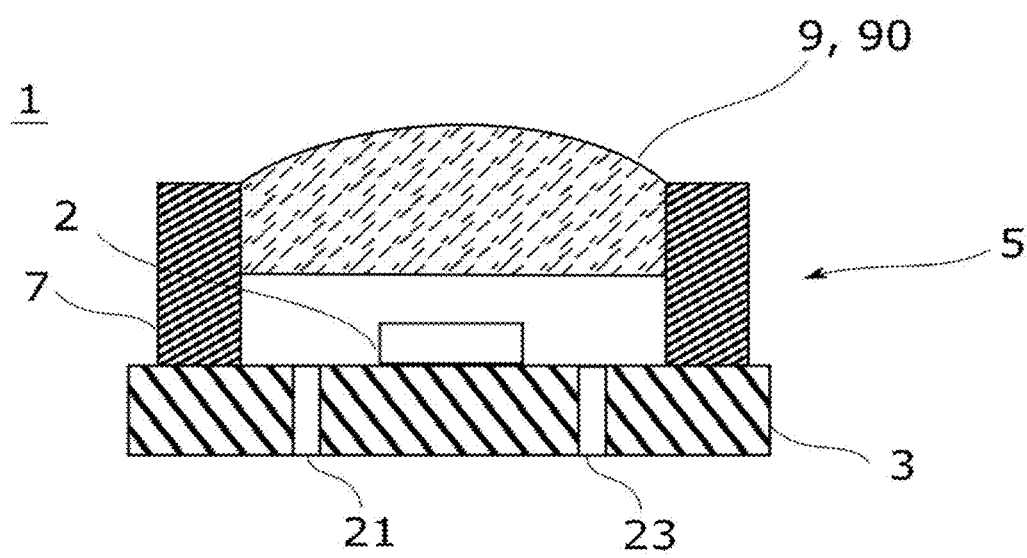
FIG. 7 shows a sectional view of an optoelectronic module according to the invention before the introduction of filler material according to a fifth embodiment of the invention.

FIG. 7 shows a fifth embodiment of an optoelectronic module 1 according to the invention in a sectional view, the module having been produced according to the processes described above in relation to FIG. 6. An optoelectronic element 2 is applied on a carrier element 3, consisting by way of example of a metal, the carrier element 3 comprising a filling opening 21 and a vent opening 23 for filling the cavity 11 with a filler material after the connection of a cover 5 to the carrier element 3. The cover 5 of the optoelectronic module 1 consists of a frame 7, in FIG. 7 by way of example made of metal, and a glass element 9, which in FIG. 7 is configured as a lens 90 and lies opposite the carrier element 3.

During filling (not represented in FIG. 7) of the cavity 11 with filler material, filler material is introduced into the cavity 11 through the filling opening 21, the vent opening 23 being used for pressure equilibration in the cavity 11 during the filling, in particular by releasing air enclosed in the cavity 11. After completion of the filling process, the filling opening 21 and the vent opening 23 need to be reclosed in order to ensure hermetic encapsulation of the optoelectronic element 2 in the cavity 11. The closure is then carried out either by soldering of the metallized filling opening 21 and of the metallized vent opening 23 of the carrier element 3 or by welding with a metal solder. In one embodiment of the invention, which is not represented, the filling opening 21 and the vent opening 23 may extend through the glass element 9, closure of the filling opening 21 and of the vent opening 23 in this case being carried out in particular by sealing with a glass solder or by sealing with the filler material 13 itself.

In one embodiment, which is not represented, it is however also possible not to close at least the vent opening, i.e., to leave it open. In another embodiment, which is not shown, it is also conceivable for a channel that is permeable for gases and/or open for diffusion to be formed from a compensation volume inside the optoelectronic module 1 toward the outside, i.e., outside of the optoelectronic module 1. In both cases, although hermetic encapsulation of the optoelectronic element 2 in the cavity 11 does not take place, the optoelectronic element 2 is nevertheless enclosed in the cavity 11 in an autoclavable fashion. Autoclavable enclosure means gas-tight closure, or enclosure, of the optoelectronic element 2 in a steam-sterilized cavity 11. In this case, the optoelectronic element 2 is closed in the cavity 11 in a gas-tight fashion for a duration of at least 15 minutes with steam at a temperature of usually from 110° C. to 140° C., preferably around 135° C., and a pressure of up to 3 bar as well as high humidity.

Figure 8:
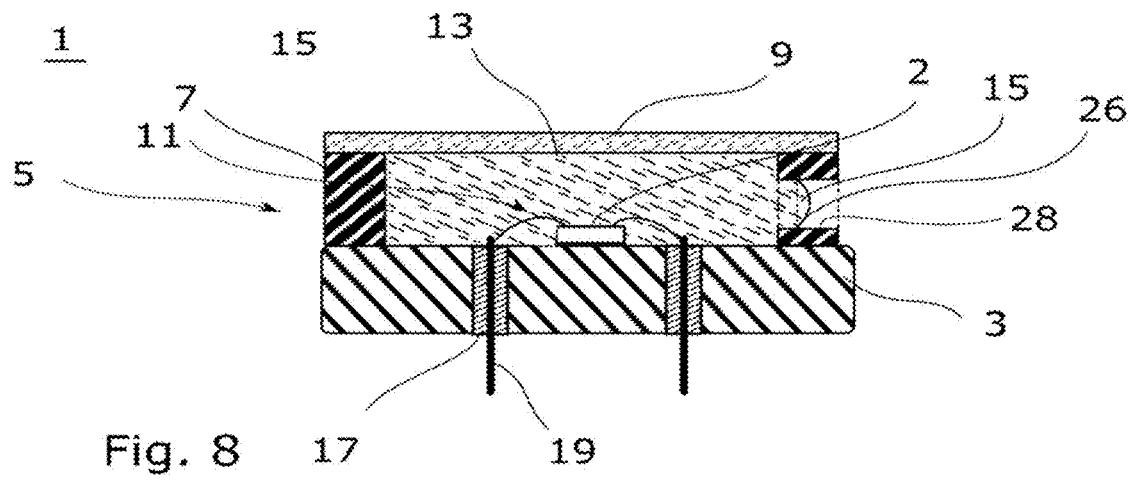
FIG. 8 shows a sectional view of an optoelectronic module according to the invention according to a sixth embodiment of the invention.
Figure 9:
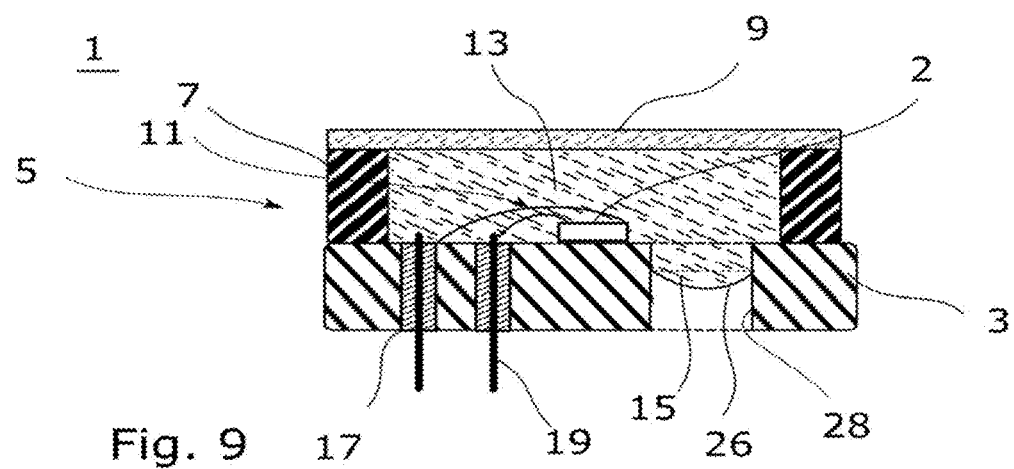
FIG. 9 shows a sectional view of an optoelectronic module according to the invention according to a seventh embodiment of the invention.

FIGS. 8 and 9 respectively show a sixth and seventh embodiment of an optoelectronic module 1 in a sectional view. The same references as in FIGS. 1 and 2 are used, and the differences from FIGS. 1 and 2 are described below. In FIGS. 8 and 9, the cover 5 respectively comprises a frame 7 and a glass element 9 configured as a glass window for input and output of electromagnetic radiation, in accordance with FIGS. 1 and 2. The frame 7 is not however configured as a frustoconical package cap, as in FIGS. 1 and 2, on the bottom of which the glass window 9 bears. The frames 7 of the cover 5 according to FIGS. 8 and 9 are configured substantially perpendicularly to the carrier element 3, and the glass window 9 is respectively fitted bearing on the frame 7 and oriented substantially parallel to the carrier element.

The frame 7 in FIG. 8 consists by way of example of metal, while the frame 7 in FIG. 9 is configured by way of example to be bimetallic and deforms, in particular bends, in the event of a temperature increase. In the event of a temperature increase, not only does the filler material 13 filling the cavity 11 in FIG. 9 therefore expand. The bimetallic frame 7 also reacts to the temperature increase, specifically by bending. In FIG. 9, the bimetallic frame 7 is designed in such a way that it bends outward, i.e., away from the cavity 11, in the event of a temperature increase, so that a hollow space that constitutes a second compensation volume is formed in the optoelectronic module 1 (this is not shown in FIG. 9). The filler material 13 can expand into this second compensation volume as a result of the temperature increase. The bimetallic frame 7 of FIG. 9 can therefore compensate for an expansion of the volume occupied by the filler material 13 by its bending in the event of temperature increase.

In order to produce the optoelectronic module 1 of FIGS. 8 and 9, the cover 5 is connected to the carrier element 3 for hermetic and/or autoclavable enclosure of the optoelectronic element 2 by soldering with a metal solder, the carrier element 3 and the cover 5 respectively comprising a solderable surface, i.e., a surface that is suitable for forming a firm connection to a solder, and the respective solderable surface comprising a solder preform. As an alternative to a soldering process with metal solder, however, in other embodiments other processes may also be used to connect the cover 5 to the carrier element 3. For example, soldering with a glass solder may be carried out. A welding process is also conceivable, for example resistance welding or laser welding, in which case the carrier element 3 is preferably a ceramic or a metal and the frame 7 is preferably a ceramic or a metal, in particular a metal coated with glass. The individual elements such as the cover 5 or frame 7 and the glass element 9, as well as the carrier element 3, may also be adhesively bonded with the filler material 13 or, however, with a silicone, polymer or joining material that differs from the filler material.

The optoelectronic modules 1 depicted in FIGS. 8 and 9 respectively comprise a compensation volume 15 arranged inside the respective optoelectronic module 1. The compensation volume 15 is respectively filled by way of example with air, although in another embodiment it may also be filled with any desired compressible medium, in particular with any desired gaseous medium. Besides a compressible medium, the compensation volume 15 could in other embodiments also be a resilient medium or a vacuum. In contrast to FIGS. 1 and 2, however, the compensation volume 15 in FIG. 8 is arranged in a recess or a bore 28 of the frame 7 and in FIG. 9 in a recess or bore 28 of the carrier element 3, and is adjacent on the one hand to the frame 7 or the carrier element 3 and on the other hand respectively to a flexible membrane 26. In contrast to FIG. 2, the membrane in FIGS. 8 and 9 is respectively arranged outside the cavity 11.

In FIG. 8, the membrane 26 is fastened on regions of the frame 7 that bear on the recess of the frame 7. If the filler material 13 expands in the event of a temperature increase as represented in FIG. 8, it presses in the direction of the compensation volume 15 arranged in the recess of the frame 7 and correspondingly exerts pressure onto the membrane 26. The membrane 26 thereupon curves outward because of its resilience away from the cavity 11, i.e., into the compensation volume 15, and delimits the filler material 13.

In FIG. 9, on the other hand, the membrane 26 is fastened on regions of the carrier element 3 that bear on the recess of the carrier element 3. If the filler material 13 expands in the event of a temperature increase as represented in FIG. 9, it presses in the direction of the compensation volume 15 arranged in the recess of the carrier element 3 and exerts pressure on the membrane 26. The membrane 26 thereupon curves outward because of its resilience away from the cavity 11, i.e., into the compensation volume 15 and delimits the filler material 13, as in FIG. 8.

Both in FIG. 8 and in FIG. 9, the membrane 26 respectively forms a constituent of the hermetic encapsulation of the optoelectronic element 2, the membrane 26 replacing a subregion of the frame 7 in FIG. 8 and a subregion of the carrier element 3 in FIG. 9 for the hermetic closure of the optoelectronic element 2.

In another embodiment, which is not represented, the recess in the frame 7 or in the carrier element 3 may also not be configured to be continuous and merely form a hollow space closed outward by the frame 7 or the carrier element 3 on the inner surface, facing toward the cavity 11, of the frame 7 or of the carrier element 3, respectively. In this case, the optoelectronic element 2 would always be fully closed hermetically by the carrier element 3 and the cover 5, while the membrane respectively arranged in the cavity would not form a constituent of the hermetic encapsulation of the optoelectronic element 2.

Figure 10:
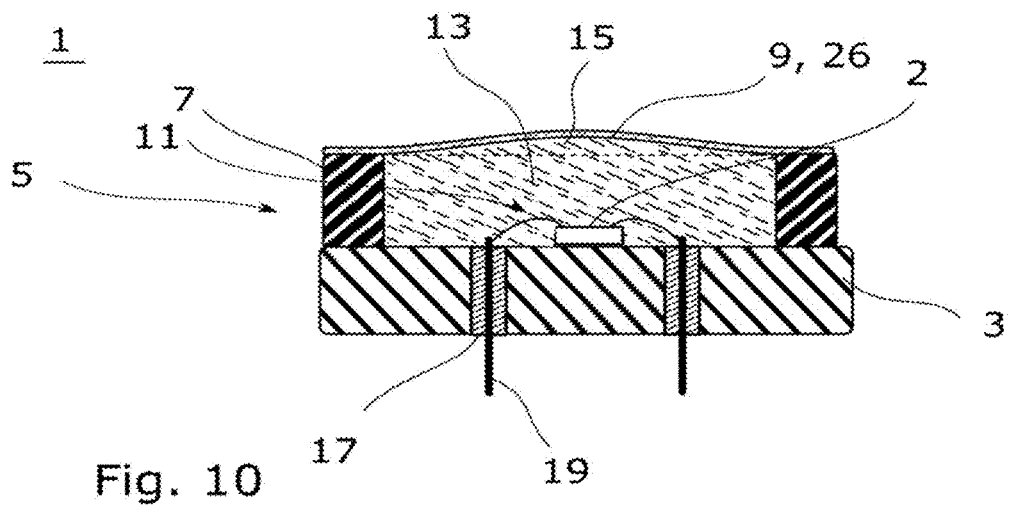
FIG. 10 shows a sectional view of an optoelectronic module according to the invention according to an eighth embodiment of the invention.

FIG. 10 represents a sectional view through an optoelectronic module 1 according to an eighth embodiment. As may also be seen by way of example in FIGS. 1-3, 8 and 9, an optoelectronic element 2 is applied on a carrier element 3, which comprises electrical feed-throughs 17 with conductors 19 extending therein for electrical contacting of the optoelectronic element 2. In FIG. 10, the cover 5 of the optoelectronic module 1 consists of a glass element 9 and a frame 5, which is produced here by way of example from metal coated with glass and is connected to the glass element 9 by the glass coating. The cavity 11 of the optoelectronic module 1 is filled by way of example fully with filler material, which in FIG. 10 is a polymer. In contrast to the embodiments described above, as may be seen in FIG. 10, the glass element 9 is deformable and correspondingly expands when a pressure is exerted onto the glass element 9. In particular, the glass element 9 is a so-called ultra-thin glass, which is stable and at the same time very flexible and therefore deformable and has a thickness in the range of from a few tens of μm to about 200 μm, by way of example about 30 μm in FIG. 10. By the expansion of the glass element 9 as a result of pressure which is exerted onto the glass element 9 in the case of expansion of the filler material 13, a compensation volume 15 into which the filler material 13 can spread is formed. Because of its deformability, the glass element 9 acts as a flexible membrane 26 and is therefore to be regarded as a possible embodiment of a membrane 26 in the scope of the present invention.

Figure 11:
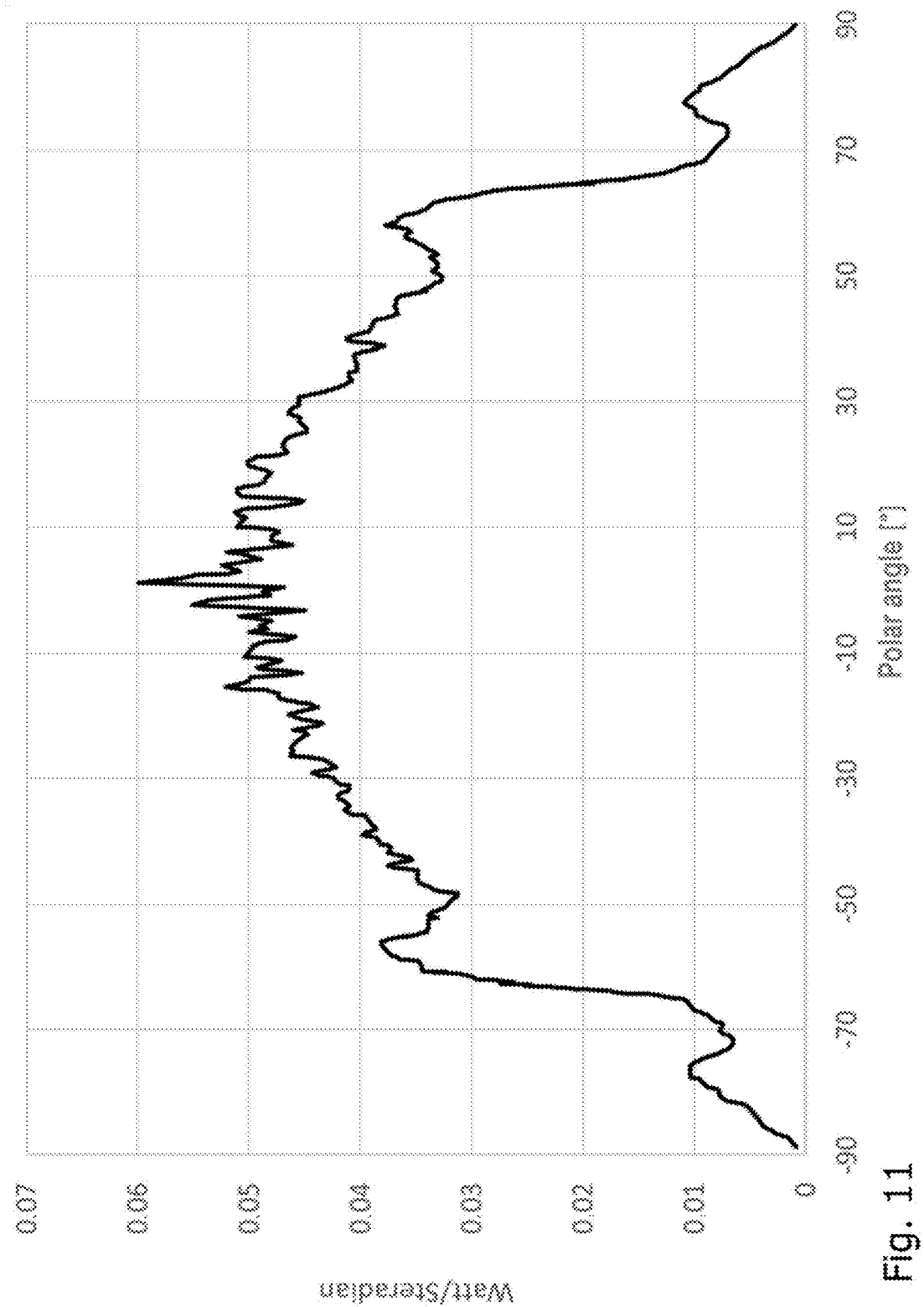
FIG. 11 shows a graphical view, based on a simulation, of a polar angle-dependent luminous power of UV light put out from an optoelectronic module without filler material.
Figure 12:
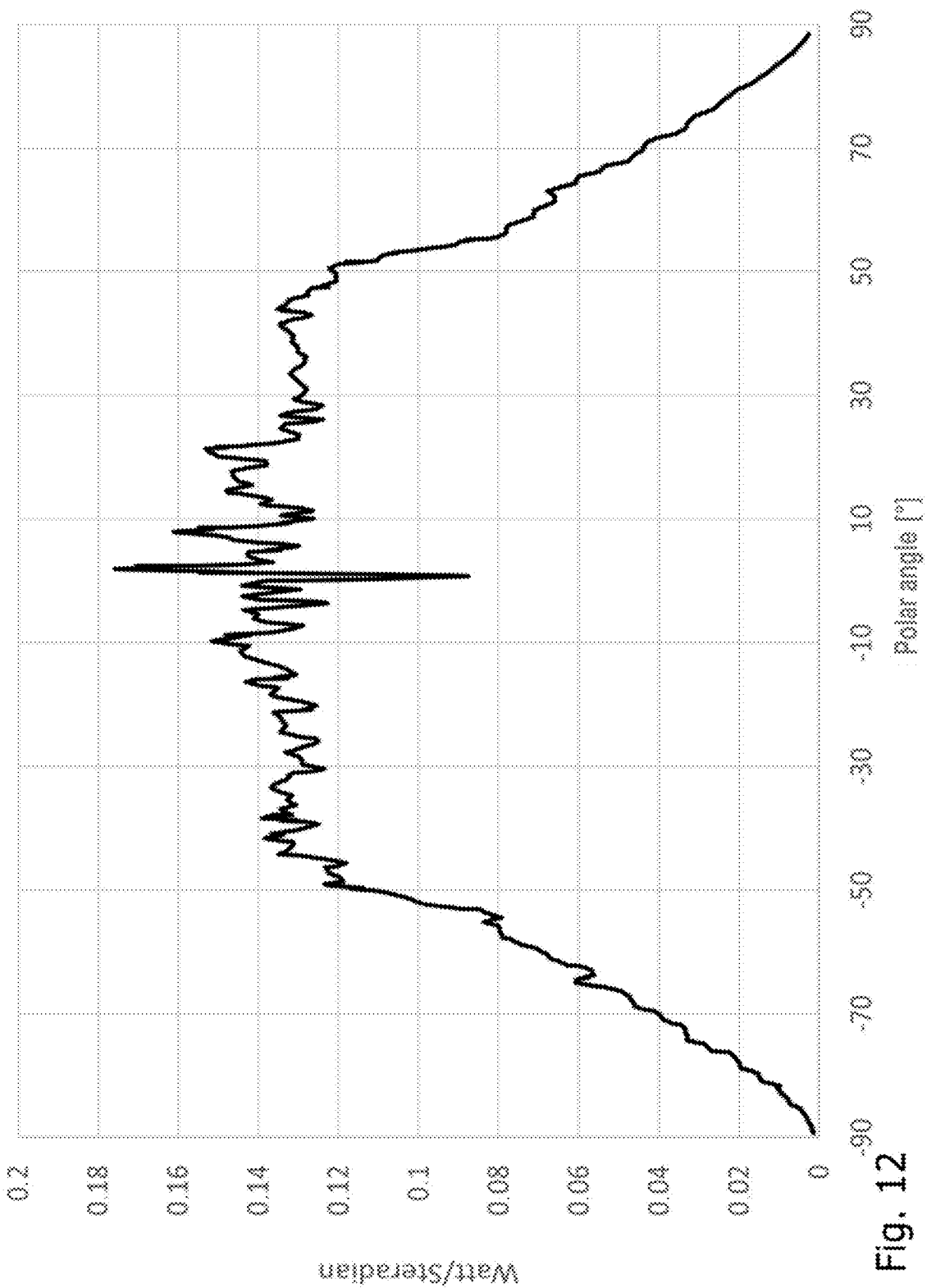
FIG. 12 shows a graphical view, based on a simulation, of a polar angle-dependent luminous power of UV light put out from an optoelectronic module according to the invention filled with silicone.

FIGS. 11 and 12 respectively show a graphical outcome of a simulated luminous power as a function of the polar angle of electromagnetic radiation emerging from an optoelectronic module with a wavelength of 280 nm, i.e., UV light. The polar angle describes the angle between the surface normal of the carrier element 3 and the emerging UV light. The glass element 9 for the output of the UV light was assumed to have a refractive index n=1.45 in the simulation. While the UV light emerges from an optoelectronic module not filled with filler material in the simulation outcome of FIG. 11, in the simulation outcome shown in FIG. 12 the UV light emerges from a silicone-filled optoelectronic module, the simulation of FIG. 12 being based on a transmission T=0.83 and a refractive index $n_F$=1.41 for silicone as the filler material. As may be seen clearly from a comparison of FIGS. 11 and 12, the luminous power of the UV light emerging from the optoelectronic module is increased by more than two times when the optoelectronic module is filled with silicone according to FIG. 12. A significantly increased light output may therefore be achieved by filling a cavity of the optoelectronic module with a suitable filler material, as shown by FIGS. 11 and 12 with the aid of the example of UV light having a wavelength of 280 nm.

Optoelectronic modules 1 according to the embodiments of the present invention as described above may be used in many different fields. For instance, they may be used inter alia on surfaces for skin treatments, tissue treatments, tumor treatments, UV-based industrial plants and vehicles.

It should be pointed out that even if these features have been described only in connection with certain other features, all features that a person skilled in the art may gather from the description above or the figures may be combined both individually and in any desired combinations with other features or feature groups disclosed in the present invention, unless this has been explicitly excluded or technical conditions make such combinations impossible or meaningless. For the sake of brevity and readability of the description, a comprehensive explicit description of all possible combinations of features has been avoided. The protective scope of the present invention as defined by the patent claims is not restricted by the embodiments of the invention as presented in detail in the description and the drawings, serving merely as examples. Variants of the embodiments disclosed will be apparent to the person skilled in the art from the drawings, the description and the appended claims. The word "comprise" used in the patent claims does not exclude other elements or steps. The indefinite article "a" or "an" does not exclude a plurality. The combination of features that are claimed in the various patent claims is not excluded. In particular, features of the examples represented in the figures may be combined with one another. For instance, a lens 90 as shown in the exemplary embodiment of FIG. 4 may also be used in any of the other exemplary embodiments shown. Besides a filler material separated by a membrane from a compensation volume, it is also possible to provide a compensation volume which, as in FIG. 1, is directly adjacent to the surface of the filler material, so that for example the features of FIG. 1 and FIG. 2 may also be implemented in the same component.

LIST OF REFERENCES

1 optoelectronic module
2 optoelectronic element
3 carrier element
5 cover
7 frame
9 glass element
11 cavity
12 through-opening
13 filler material
14 nonwetting or nonadhesive coating
15 compensation volume
17 electrical feed-through
19 conductor of 17
21 filling opening
23 vent opening
25 meniscus
26 membrane
27 bubble
28 bore
90 lens

What is claimed is:
1. An optoelectronic module, comprising:
a carrier element;
an optoelectronic element on the carrier element;
a cover having a frame and a glass element, the frame being connected to the carrier element so as to fully surround the optoelectronic element in a circumferential direction, the glass element being on the frame and lying substantially opposite the carrier element, the glass element being configured to input and/or output electromagnetic radiation into the optoelectronic element through the cover;
a cavity defined by an inner surface of the cover and an upper surface of the carrier element, the optoelectronic element being hermetically and/or autoclavably secured in the cavity;
a filler material in the cavity; and
a deformable compensation volume configured to compensate for an expansion of a volume occupied by the filler material,
wherein the optoelectronic element has a beam path between the optoelectronic element and the glass element that is free from the deformable compensation volume.

2. The optoelectronic module of claim 1, wherein the deformable compensation volume comprises a material selected from a group consisting of a compressible medium, a gaseous medium, a resilient medium, and a vacuum.

3. The optoelectronic module of claim 1, further comprising a coating that is nonwetting for the filler material and/or nonadhesive for the filler material so that the deformable compensation volume is formed by detachment of the filler material from the coating.

4. The optoelectronic module of claim 3, wherein the coating is on a subregion of the cover and/or a subregion of the carrier element.

5. The optoelectronic module of claim 4, wherein the deformable compensation volume is arranged adjacent to the subregion.

6. The optoelectronic module of claim 1, wherein the deformable compensation volume is fully surrounded by the filler material.

7. The optoelectronic module of claim 6, wherein the deformable compensation volume formed as a bubble.

8. The optoelectronic module of claim 1, wherein the deformable compensation volume is between the frame and the cavity and/or between the carrier element and the cavity.

9. The optoelectronic module of claim 1, wherein the deformable compensation volume comprises a flexible membrane connected to the frame or the carrier element.

10. The optoelectronic module of claim 9, wherein the flexible membrane delimits a hermetically closed portion of the cavity.

11. The optoelectronic module of claim 1, wherein the filler material is a material selected from a group consisting of silicone, polymer, epoxy resin, and oil.

12. The optoelectronic module of claim 1, wherein the frame is a material selected from a group consisting of ceramic, metal, metal coated with glass, metal coated with ceramic, and ceramic coated with glass.

13. The optoelectronic module of claim 1, wherein the carrier element comprises an electrical layout for contacting the optoelectronic element.

14. The optoelectronic module of claim 1, wherein the optoelectronic module is configured and adapted for a use selected from a group consisting of: skin treatment, tissue treatment, tumor treatment, a UV-based industrial plant, a vehicle, a UV-B treatment of liquid, a UV-B treatment of gas, a UV-C treatment of liquid, and a UV-C treatment of gas.

15. A method for producing an optoelectronic module, comprising:
applying an optoelectronic element on a carrier element;
connecting a frame to the carrier element with the frame surrounding the optoelectronic element;

connecting a glass element to the frame so that the glass element lies substantially opposite the carrier element with the glass element configured and positioned to input and/or output electromagnetic radiation into the optoelectronic element through a cover and so that the optoelectronic element is arranged in a hermetic and/or autoclavable cavity;

placing a filler material in the cavity; and forming a deformable compensation volume in the cavity, so that a beam path of the optoelectronic element between the optoelectronic element and the glass element is free from the deformable compensation volume.

16. The method of claim 15, wherein the step of placing the filler material in the cavity comprises placing the filler material in the cavity before the step of connecting the frame to the carrier element and/or before the step of connecting the glass element to the frame.

17. The method of claim 15, wherein the step of placing the filler material in the cavity comprises:

placing the filler material in the cavity through an opening into the cavity; and closing, with a hermetic and/or autoclavable closure, the opening after the placing step.

18. The method of claim 17, wherein the opening is in a location selected from a group consisting of in the carrier element, in the frame, and in the glass element.

19. The method of claim 17, further comprising:

venting the cavity through a vent opening during the placing step; and closing, with a hermetic and/or autoclavable closure, the vent opening after the placing step.

20. The method of claim 19, wherein the vent opening is in a location selected from a group consisting of in the carrier element, in the frame, and in the glass element.

21. An optoelectronic module, comprising:

a carrier element;

an optoelectronic element on the carrier element;

a cover having a frame and a glass element, the frame being connected to the carrier element so as to fully surround the optoelectronic element in a circumferential direction, the glass element being on the frame and lying substantially opposite the carrier element, the glass element being configured to input and/or output electromagnetic radiation into the optoelectronic element through the cover;

a cavity defined by an inner surface of the cover and an upper surface of the carrier element, the optoelectronic element being hermetically and/or autoclavably secured in the cavity;

a filler material in the cavity; and a deformable compensation volume configured to compensate for an expansion of a volume occupied by the filler material, further comprising a coating that is nonwetting for the filler material and/or nonadhesive for the filler material so that the deformable compensation volume is formed by detachment of the filler material from the coating.

22. An optoelectronic module, comprising:

a carrier element;

an optoelectronic element on the carrier element;

a cover having a frame and a glass element, the frame being connected to the carrier element so as to fully surround the optoelectronic element in a circumferential direction, the glass element being on the frame and lying substantially opposite the carrier element, the glass element being configured to input and/or output electromagnetic radiation into the optoelectronic element through the cover;

a cavity defined by an inner surface of the cover and an upper surface of the carrier element, the optoelectronic element being hermetically and/or autoclavably secured in the cavity;

a filler material in the cavity; and a deformable compensation volume configured to compensate for an expansion of a volume occupied by the filler material, wherein the deformable compensation volume comprises a flexible membrane connected to the frame or the carrier element.

23. An optoelectronic module, comprising:

a carrier element;

an optoelectronic element on the carrier element;

a cover having a frame and a glass element, the frame being connected to the carrier element so as to fully surround the optoelectronic element in a circumferential direction, the glass element being on the frame and lying substantially opposite the carrier element, the glass element being configured to input and/or output electromagnetic radiation into the optoelectronic element through the cover;

a cavity defined by an inner surface of the cover and an upper surface of the carrier element, the optoelectronic element being hermetically and/or autoclavably secured in the cavity;

a liquid filler material in the cavity; and a deformable compensation volume configured to compensate for an expansion of a volume occupied by the liquid filler material.

\* \* \* \* \*